United States Patent
Feng et al.

(10) Patent No.: US 10,168,719 B2
(45) Date of Patent: Jan. 1, 2019

(54) DIGITAL LOW DROPOUT REGULATOR AND CONTROL METHOD THEREOF

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Xuehuan Feng, Beijing (CN); Pan Xu, Beijing (CN); Yongqian Li, Beijing (CN); Zhongyuan Wu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 0 days.

(21) Appl. No.: 15/852,330

(22) Filed: Dec. 22, 2017

(65) Prior Publication Data
US 2018/0314283 A1    Nov. 1, 2018

(30) Foreign Application Priority Data

Apr. 28, 2017    (CN) .......................... 2017 1 0297513

(51) Int. Cl.
*G05F 1/575*    (2006.01)
*G05F 1/56*    (2006.01)
(Continued)

(52) U.S. Cl.
CPC ............. *G05F 1/575* (2013.01); *G05F 1/561* (2013.01); *G05F 1/563* (2013.01); *H03K 5/1534* (2013.01);
(Continued)

(58) Field of Classification Search
CPC .......... G05F 1/575; G05F 1/563; G05F 1/561; H03K 5/1534; H03K 21/026; H03K 5/2481
(Continued)

(56) References Cited

U.S. PATENT DOCUMENTS 5,060,244 A * 10/1991 Robertson ............... H03K 21/12
                                                                    377/39
5,535,216 A *  7/1996 Goldman ............... H04J 3/0632
                                                                    327/144
(Continued)

FOREIGN PATENT DOCUMENTS

CN    105183059 A    12/2015
CN    105676933 A    6/2016

OTHER PUBLICATIONS

Received STIC search reports from EIC 2800 searcher Samir Patel dated Apr. 3, 2018 and Apr. 5, 2018 for claims 1 and 2.*
(Continued)

*Primary Examiner* — Timothy J Dole
*Assistant Examiner* — Htet Z Kyaw
(74) *Attorney, Agent, or Firm* — Foley & Lardner LLP; James F. Ewing; Paul M. H. Pua

(57) ABSTRACT

The present invention provides a digital low dropout regulator and a control method thereof. The regulator comprises a voltage comparator, a counter, a decoder, a PMOSFET array and a divider. The voltage comparator receives an actual voltage output from the PMOSFET array through the positive input terminal, receives a reference voltage through the negative input terminal, and compares the actual voltage and the reference voltage to obtain a level signal. The divider calculates based on an output voltage pre-configured for a PMOSFET array and an actual voltage output by the PMOSFET array in at least two clock cycles to obtain a first value. The counter generates a control signal based on the level
(Continued)

signal and the first value. The decoder receives the control signal transmitted by the counter and controlling the number of switched-on transistors, in the PMOSFET on a basis of the control signal.

16 Claims, 4 Drawing Sheets

(51) Int. Cl.
*G05F 1/563* (2006.01)
*H03K 5/24* (2006.01)
*H03K 21/02* (2006.01)
*H03K 5/1534* (2006.01)

(52) U.S. Cl.
CPC ......... *H03K 5/2481* (2013.01); *H03K 21/026* (2013.01)

(58) Field of Classification Search
USPC ................ 323/280, 269, 273, 293, 314, 315
See application file for complete search history.

(56) References Cited

U.S. PATENT DOCUMENTS

| | | | | |
|---|---|---|---|---|
| 6,469,933 B2 * | 10/2002 | Choi | ...................... | G11C 16/12 365/185.17 |
| 6,541,946 B1 | 4/2003 | Chen et al. | | |
| 9,417,643 B2 * | 8/2016 | Saint-Laurent | ......... | G05F 1/468 |
| 9,886,047 B2 * | 2/2018 | Yoshii | ...................... | G05F 1/575 |
| 2006/0066759 A1 * | 3/2006 | Ikuma | .................. | H04N 5/4446 348/735 |
| 2009/0085651 A1 * | 4/2009 | Liu | ........................... | G05F 3/30 327/539 |
| 2009/0128107 A1 * | 5/2009 | Wang | ...................... | G05F 1/575 323/280 |
| 2010/0213917 A1 | 8/2010 | Pulijala et al. | | |
| 2011/0248688 A1 * | 10/2011 | Iacob | ...................... | G05F 1/575 323/234 |
| 2012/0249114 A1 * | 10/2012 | Sako | ........................ | G05F 1/561 323/312 |
| 2014/0084881 A1 | 3/2014 | Shin et al. | | |
| 2014/0104962 A1 * | 4/2014 | Chen | ........................ | G11C 7/10 365/189.07 |
| 2014/0111173 A1 * | 4/2014 | Lee | ........................... | G05F 1/565 323/281 |
| 2015/0241890 A1 * | 8/2015 | Raychowdhury | ......... | G05F 1/56 713/300 |

OTHER PUBLICATIONS

CN Office Action received in CN Appl. No. 201710297513.7, dated Nov. 6, 2017.
CN Office Action for CN Application No. 201710297513.7, dated Feb. 13, 2018.
Third Office Action for CN Application No. 201710297513.7, dated May 17, 2018.

* cited by examiner

DIGITAL LOW DROPOUT REGULATOR AND CONTROL METHOD THEREOF

CROSS-REFERENCE TO RELATED APPLICATION

The present application claims priority to Chinese Patent Application No. 201710297513.7 filed on Apr. 28, 2017, the disclosure of which is incorporated herein by reference in its entirety.

TECHNICAL FILED

The present disclosure relates a digital low dropout regulator and a control method thereof.

BACKGROUND

At present, LDO (Low Dropout Regulator) as a power management circuit has been widely used in portable electronic devices, wireless energy transmission systems and other fields. A conventional LDO is a linear circuit, which has the advantages of low output ripple, simple circuit structure, small chip area and the capability of being fully integrated as compared with a switching regulator circuit. But because of its analog circuit characteristics, it has poor process transferability, and is difficult to work at a low voltage. Therefore, the digital LDO structure emerges for this problem. The digital LDO has the characteristics of a digital circuit, with good process transferability, and can work at a very low power supply voltage.

A conventional digital LDO without off-chip capacitors includes a voltage comparator, a counter, a PMOSFET (Metal-Oxide Semiconductor Field Effect Transistor) array, and a feedback resistor network. When the output feedback voltage is less than the reference voltage, the comparator outputs a low level, otherwise, outputs a high level. The counter controls the number of turned-on transistors in the PMOSFET array according to an output value of the comparator, thereby to adjust the output voltage and ultimately achieve the purpose of stable output voltage.

SUMMARY

The embodiments of the present disclosure provide a digital low dropout regulator and a control method thereof.

The embodiments of the present disclosure use the following technical solution:

In a first aspect, there is provided a digital low dropout regulator, comprising: a voltage comparator, a counter, a decoder, a PMOSFET array, and a divider;

an output terminal of said voltage comparator is connected with a first input terminal of the counter, an output terminal of the counter is connected with an input terminal of the decoder, and an output terminal of the decoder is connected with an input terminal of the PMOSFET array, output terminals of the PMOSFET array are respectively connected with a positive input terminal of the voltage comparator and a first input terminal of the divider, an output terminal of the divider is connected to a second input terminal of the counter, and a negative input terminal of the voltage comparator receives a reference voltage;

said voltage comparator is configured to receive an actual voltage output by the PMOSFET array through the positive input terminal, receive a reference voltage through the negative input terminal, compare the actual voltage and the reference voltage to obtain a level signal, and transmit the level signal to the counter;

said divider is configured to calculate based on an output voltage pre-configured for said PMOSFET array and an actual voltage output by said PMOSFET array in at least two clock cycles to obtain a first value and transmit said first value to the counter, wherein the first value corresponds to the number of PMOSFETs in the PMOSFET array controlled by the decoder;

said counter is configured to generate a control signal based on said level signal and said first value and transmit said control signal to said decoder;

said decoder is configured to receive a control signal transmitted by said counter and control the number of transistors, which are switched on, in the PMOSFET array according to the control signal.

In a second aspect, there is provided a control method of a digital low dropout regulator for controlling the digital low dropout regulator according to the embodiment of the first aspect, said method comprising:

receiving the reference voltage and the actual voltage output by the PMOSFET array and comparing the actual voltage and the reference voltage to obtain a level signal;

calculating based on an output voltage pre-configured for the PMOSFET array and an actual voltage output by the PMOSFET array in at least two clock cycles to obtain a first value, the first value corresponding to the number of controlled PMOSFETs in the PMOSFET array;

generating a control signal based on the level signal and the first value;

controlling the number of transistors, which are switched on, in the PMOSFET array according to the control signal.

BRIEF DESCRIPTION OF THE DRAWINGS

In order to illustrate the technical solution of the embodiments of the present invention or in the related technology more clearly, the drawings to be used in the description of the embodiments or the related technology will be briefly described as follows. Apparently, the drawings described below relate only to some embodiments of the present disclosure, and other drawings may be obtained by those skilled in the art based on the aforementioned drawings without paying any creative effort.

DETAILED DESCRIPTION

The technical solution of the embodiments of the present disclosure will be described below in a clear and comprehensive manner with reference to the accompanying drawings of the embodiments of the present disclosure. Obviously, the described embodiments are only a part, rather than all, of the embodiments of the present disclosure. All the other embodiments obtained by an ordinary person skilled in the art based on the embodiments described in the present disclosure without paying any creative effort are within the scope of protection of the present disclosure.

"A and/or B" in this application represents three options: A, or B, or A and B. That is, "and/or" can express an "and" relationship, and can also express an "or" relationship.

It should also be noted that the words "first" and "second" in the present application are only intended to distinguish the same or similar terms having substantially the same function and usage, rather than defining the number and the sequence of execution.

Figure 1:
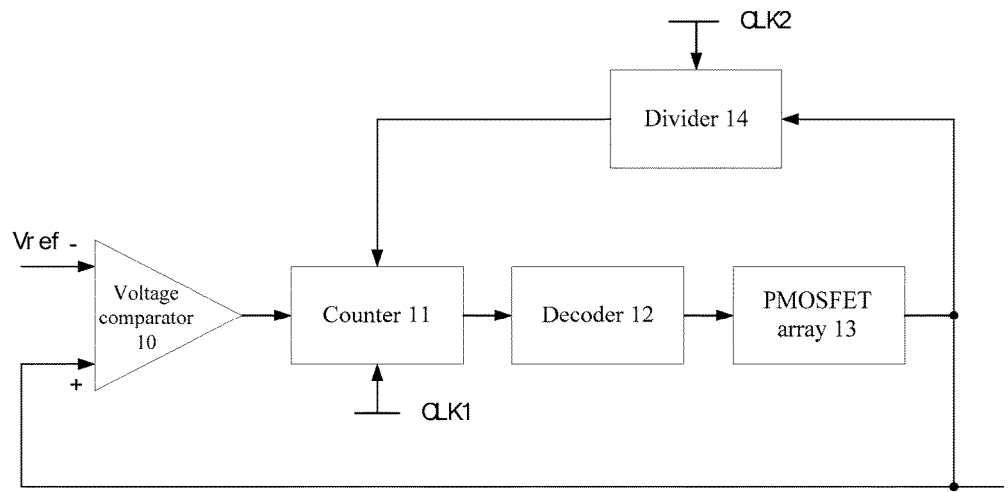
FIG. 1 is a schematic diagram of a digital low dropout regulator provided in some embodiments of the present disclosure.

An embodiment of the present disclosure provides a digital low dropout regulator, which includes a voltage comparator 10, a counter 11, a decoder 12, a PMOSFET array 13, and a divider 14 as shown in FIG. 1.

Wherein, an output terminal of the voltage comparator 10 is connected to a first input terminal of the counter 11; an output terminal of the counter 11 is connected to an input terminal of the decoder 12; an output terminal of the decoder 12 is connected to an input terminal of the PMOSFET array 13; output terminals of the PMOSFET array 13 are respectively connected to a positive input terminal of the voltage comparator 10 and a first input terminal of the divider 14; an output terminal of the divider 14 is connected to a second input terminal of the counter 11; and the negative input terminal of the voltage comparator 10 receives a reference voltage (referred to as: Vref).

The voltage comparator 10 is used to compare an input voltage at the positive input terminal with an input voltage at the negative input terminal and output a level signal.

Specifically, the voltage comparator 10 is for receiving an actual voltage output from the PMOSFET array 13 through the forward input terminal, receiving a reference voltage through the negative input terminal, comparing the actual voltage and the reference voltage to obtain a level signal, and transmitting the level signal to the counter 11.

Exemplarily, the reference voltage received by the negative input of the voltage comparator 10 refers to a voltage value used as the reference point during measurement of voltage value. In a case where the low dropout voltage regulator is operating, the input voltage at the positive input terminal of the voltage comparator 10 is the output voltage at the output terminal of the PMOSFET array 13. The voltage comparator 10 compares the input voltage at the positive input terminal and the reference voltage. When the input voltage of the positive input terminal of the voltage comparator 10 is greater than the reference voltage, the voltage comparator 10 outputs a high level signal. When the input voltage of the positive input terminal of the voltage comparator 10 is smaller than the reference voltage, the voltage comparator 10 outputs a low level signal.

The divider 14 is for calculating a first value based on an output voltage pre-configured for the PMOSFET array and an actual voltage output by the PMOSFET array in at least two clock cycles and sending the first value to the counter 11, wherein the first value corresponds to the number of PMOSFETs in the PMOSFET array 13 which are controlled by the decoder 12.

Specifically, the divider 14 acquires a change value VX of the actual voltage output from the PMOSFET array 13 in two adjacent cycles. It should be noted that the range of the clock cycles may be extended and set in such a way that an average value VX of the change value of the actual voltage output by the PMOSFET array 13 is measured within three or more cycles. That is, VX is an average value of the change value of the actual voltage output by the PMOSFET array between every two adjacent cycles among at least two cycles. The embodiment of the present disclosure is described by taking two adjacent clock cycles as an example. The output voltage pre-configured for the PMOSFET array 13 stored in the divider 14 is V0, and the divider 14 calculates the value of N on a basis of a preset formula $$N = \frac{V0}{VX}$$

and rounds the value of N to obtain an integer C, and converts the integer C by conversion of radix systems from a decimal number into a binary number, i.e., a first value. The first value corresponds to the number of PMOSFETs in the PMOSFET array 13 which are controlled by the decoder 12, that is, corresponds to the number of turned-on PMOS transistors in the PMOSFET array 13 in the next clock cycle.

The counter 11 is for generating a control signal based on the level signal and the first value, and transmits a control signal to the decoder 12.

Specifically, the counter 11 generates a control signal by receiving the high-level signal or the low-level signal transmitted from the voltage comparator 10 and the first value transmitted by the divider 14, and sends the control signal to the decoder 12. Exemplarily, the counter consists of a basic counting unit and a number of control gates. The counting unit consists of a series of various types of flip-flops having a function of information storage. The flip-flops include RS flip-flops, T flip-flops, D flip-flops and JK flip-flops. The counter 11 can not only record the number of input clock pulses, but also can achieve frequency division, timing, generation of beat pulse and pulse sequence, etc. For example, the timing generator, frequency divider and instruction counter, etc. in a computer all use a counter. There are many types of counters. According to the difference in the manner of clock pulse inputting, counters may be divided into synchronous counters and asynchronous counters. According to the difference in radix system, counters can be divided into binary counters and non-binary counters. According to the numerical increase and decrease tendency during counting, counters can be divided into up counters, down counters and reversible counters.

Alternatively, a third input terminal of the counter 11 is connected to a first clock signal terminal CLK1, and the counter 11 obtains a clock cycle based on the first clock signal terminal CLK1. A second input terminal of the divider 14 is connected to the second clock signal terminal, and the divider 14 obtains a clock cycle based on a clock signal of the second clock signal terminal CLK2. It is to be noted that the clock signals output from the first clock signal terminal CLK1 and the second clock signal terminal CLK2 are synchronized so that the clock cycle of the counter 11 is synchronized with the clock cycle of the divider 14.

The decoder 12 is for receiving the control signal transmitted by the counter and controlling the number of turned-on transistors in the PMOSFET array 13 in accordance with the control signal.

Specifically, the decoder 12 analyzes the first value. That is, the decoder 12 converts the first value into a decimal number by conversion of radix systems. The decimal number is a positive integer. It is determined how many high level signals or low level signals there are according to the high level signals or low level signals transmitted by the counter 11 as well as the decimal number. Since the PMOSFET array 13 consists of PMOS transistors, which are cut off at a high level and turned on at a low level, when the decimal number is 20 and the level signal is at a low level, the decoder 12 controls the number of turned-on transistors in the PMOSFET array 13 to be 20.

Figure 2:
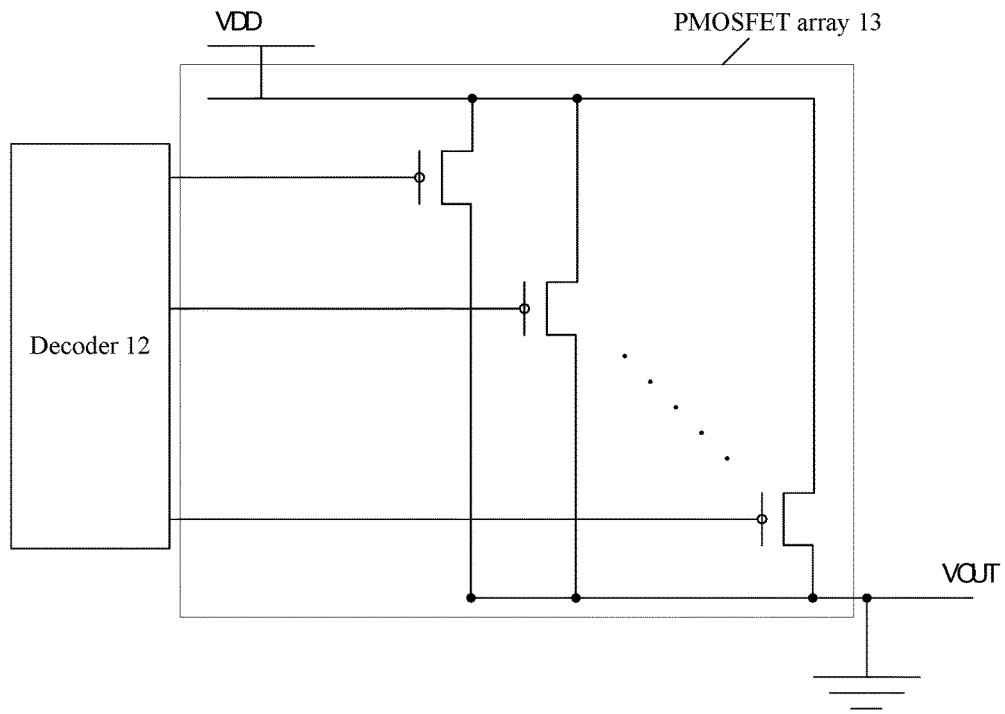
FIG. 2 is a diagram of a PMOSFET array in the digital low dropout regulator provided in some embodiments of the present disclosure.

Exemplarily, FIG. 2 shows a diagram of a PMOSFET array in a digital low dropout regulator provided by an embodiment of the present disclosure, wherein the PMOSFET array is composed of a plurality of PMOS transistors. The decoder 12 connected to an input terminal of the PMOSFET array 13 is used for supplying M high or low level signals to the PMOSFET array. When M high level signals are input, M PMOS transistors are turned off. When M low level signals are input, M PMOS transistors are turned on.

Exemplarily, the process that the digital low dropout regulator provided by the embodiment of the present disclosure quickly reaches a stable voltage value is taken as an example for description. A voltage output by an output terminal of the PMOSFET array within a first clock cycle is set to be V1, V1=0.2V, and a voltage output by an output terminal of the PMOSFET array in a second clock cycle is set to be V2, V2=0.25, then VX=V2−V1=0.05V. The output voltage V0 preconfigured for the PMOSFET array 13 stored by the divider is set to be 1.5V, and then it can be derived according to the formula $$N = \frac{V0}{VX}$$

that N=30, and then the value of N is rounded to obtain an integer C=30. Thereafter, the integer C goes through the counter 11 and the decoder 12. After the decoder 12 receives a low level signal and analyzes the first value, the number of turned-on PMOS transistors in the PMOSFET array 13 is controlled to be 30. Then, in the third clock cycle, the digital low dropout regulator reaches a stable voltage value so as to output a stable voltage.

Exemplarily, a voltage output by an output terminal of the PMOSFET array within a first clock cycle is set to be V1, V1=0.2, a voltage output by the output terminal of the PMOSFET array within a second clock cycle is set to be V2, V2=0.25V, and a voltage output by the output terminal of the PMOSFET array within a third clock cycle is set to be V3, V3=0.32V. Then, according to the formula of the average value of the change value of the actual voltage, $$VX = \frac{V3 - V1}{2},$$

it can be derived that V3=0.06V. When the set voltage V0 stored by the divider is set to be 1.7V, then according to the formula, $$N = \frac{V0}{VX},$$

it can be derived that N=28.3. Since the value C is an integer obtained by rounding the value of N, C=28. Thereafter, the integer C goes through the counter 11 and the decoder 12. After the decoder 12 receives a low level signal and analyzes a first value, the number of turned-on PMOS transistors in the PMOSFET array 13 is controlled to be 28. Then, in the fourth clock cycle, the digital low dropout regular reaches a stable voltage so as to output a stable voltage.

A digital low dropout regulator provided by an embodiment of the present disclosure includes a voltage comparator, a counter, a decoder, a PMOSFET array, and a divider. The voltage comparator receives an actual voltage output from the PMOSFET array through the positive input terminal, receives a reference voltage through the negative input terminal, compares the actual voltage and the reference voltage to obtain a level signal, and sends the level signal to the counter. The divider calculates based on an output voltage pre-configured for the PMOSFET array and an actual voltage output by the PMOSFET array in at least two clock cycles to obtain a first value and sends the first value to the counter, wherein the first value corresponds to the number of PMOSFETs in the PMOSFET array controlled by the decoder. The counter generates a control signal based on the level signal and the first value, and sends the control signal to the decoder. The decoder receives the control signal sent by the counter and controls the number of turned-on transistors in the PMOSFET array according to the control signal. According to the embodiment of the present disclosure, the digital low dropout regulator can reach a stable voltage value as soon as possible so as to output a stable voltage.

Figure 3:
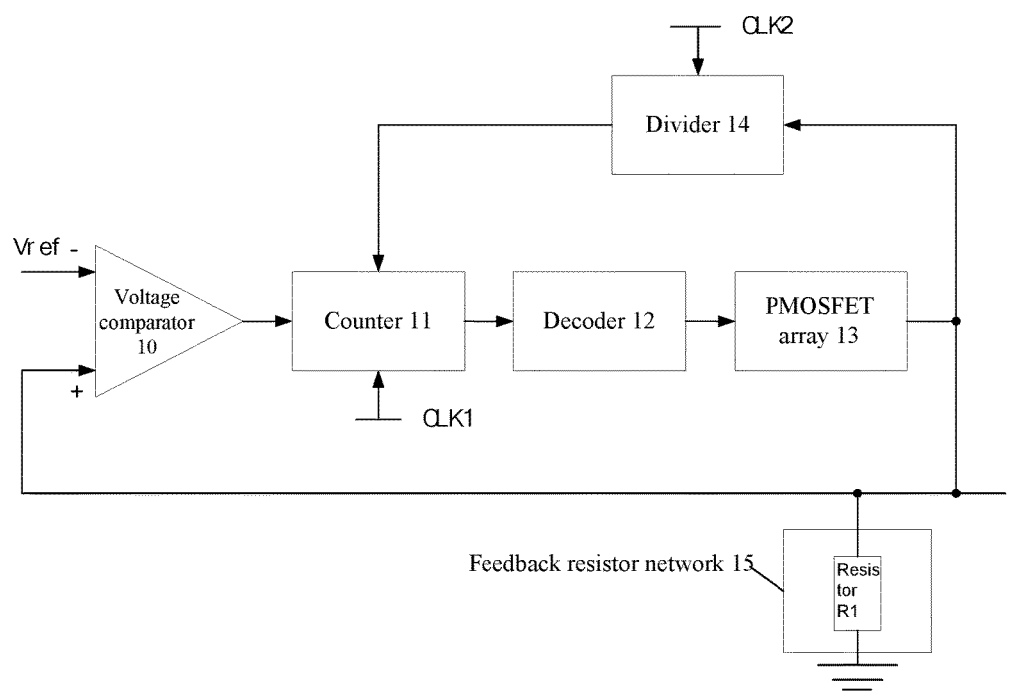
FIG. 3 is another schematic diagram of a digital low dropout regulator provided in some embodiments of the present disclosure.

Optionally, as illustrated by FIG. 3, the digital low dropout regulator provided by the embodiment of the present disclosure also includes a feedback resistor network 15. A first terminal of the feedback resistor network 15 is connected to an output terminal of the PMOSFET array 13, and a second terminal of the feedback resistor network 15 is grounded. The feedback resistor network 15 is used to shunting the electric current output by an output terminal of the PMOSFET array 13.

Exemplarily, the feedback resistor network 15 includes a resistor R1 which is used for shunting the current at the output terminal of the PMOSFET array 13 to avoid damage to the internal parts by preventing the current of the digital low dropout regulator from being excessive. Further, the feedback resistor network 15 may also include two or more resistors which are connected in any manner. The present disclosure does not limit the resistors of the feedback resistor network 15 and the manner of connection therebetween, as long as the function of shunting the current at the output terminal of the PMOSFET array 13 can be achieved.

Figure 4:
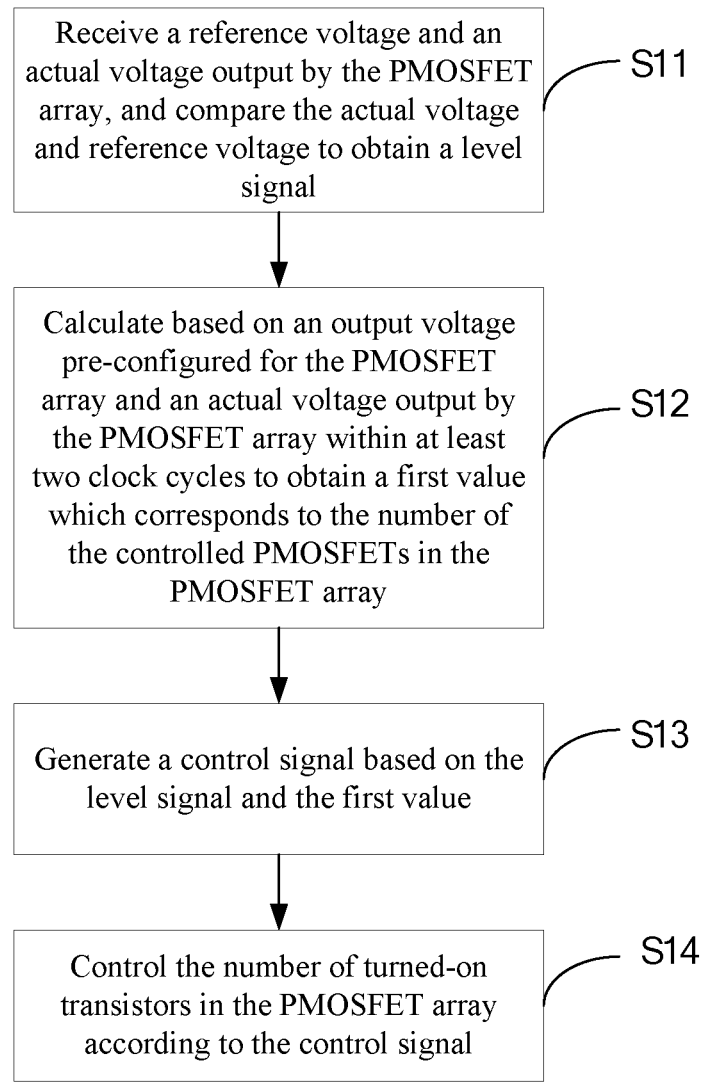
FIG. 4 is a flow diagram of a control method for a digital low dropout regulator provided in some embodiments of the present disclosure.

The embodiment of the present disclosure provides a control method of a digital low dropout regulator for controlling the digital low dropout regulator provided in the above embodiment. As illustrated by FIG. 4, the method comprising:

S11, receiving a reference voltage and an actual voltage output by the PMOSFET array and comparing the actual voltage and the reference voltage to obtain a level signal;

Specifically, the voltage received at the negative input terminal of the voltage comparator is a reference voltage, which is the voltage value used as the reference point when the voltage value is measured. In a case where the low dropout regulator is operating, the input voltage at the positive input terminal of the voltage comparator is the output voltage at the output terminal of the PMOSFET array. The voltage comparator compares the input voltage at the positive input terminal and the reference voltage. When the input voltage of the positive input terminal of the voltage comparator is greater than the reference voltage, the voltage comparator outputs a high level signal, and when the input voltage at the positive input terminal of the voltage comparator is less than the reference voltage, the voltage comparator will output a low signal.

S12, calculating based on the output voltage pre-configured for the PMOSFET array and the actual voltage output by the PMOSFET array in at least two clock cycles to obtain a first value, wherein the first value corresponds to the number of controlled PMOSFETs in the PMOSFET array.

Figure 5:
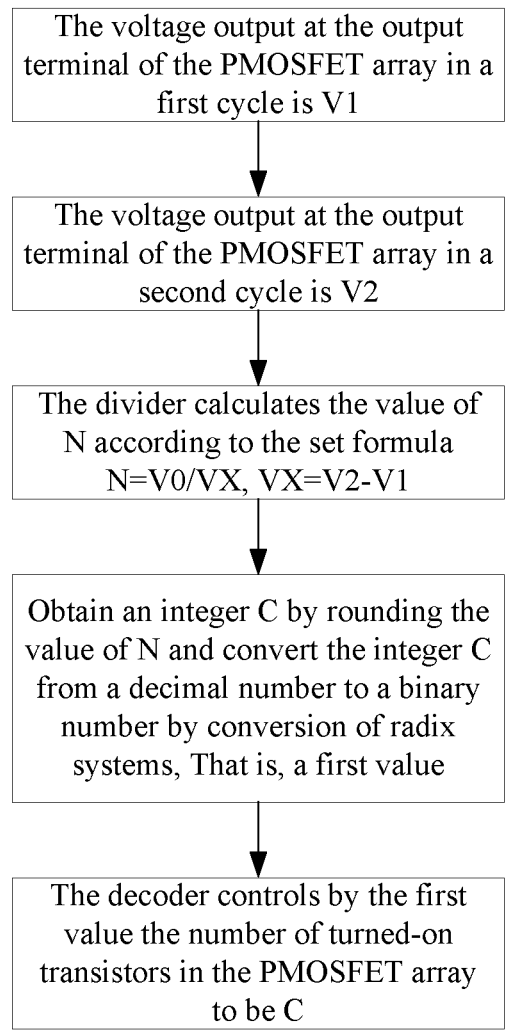
FIG. 5 is a schematic diagram of the workflow of a digital low dropout regulator provided in some embodiments of the present disclosure.

Specifically, referring to the schematic diagram of the working flow of a digital low dropout regulator shown in FIG. 5, the divider 14 acquires a change value VX of the actual voltage output by the PMOSFET array 13 in two adjacent cycles. It is to be noted that the range of the clock cycle can also be extended, and set in such a way that the average value VX of the change value of the actual voltage output by the PMOSFET array 13 is measured in three or more clock cycles. That is, VX is an average value of the change value of the actual voltage output by the PMOSFET array between every two adjacent cycles among at least two cycles. The embodiment of the present disclosure makes description by taking two adjacent clock cycles as an example. The output voltage pre-configured for the PMOSFET array 13 stored in the divider 14 is V0, and the divider 14 calculates the value of N according to the set formula, $$N = \frac{V0}{VX},$$

and rounds the value of N to obtain an integer C, and converts the integer C by conversion of radix systems from a decimal number into a binary number, i.e., a first value. The first value corresponds to the number of PMOSFETs in the PMOSFET array controlled by the decoder 12, that is, corresponds to the number of turned-on PMOS transistors in the PMOSFET array 13 in the next clock cycle.

Exemplarily, a voltage output at the output terminal of the PMOSFET array in the first cycle is set to be V1, V1=0.2V, and a voltage output at the output terminal of the PMOSFET array in the second cycle is V2, V2=0.25, then VX=V2−V1=0.05V. The output voltage V0 pre-configured for the PMOSFET array 13 stored by the divider is set to be 1.5V, then it can be derived from the formula $$N = \frac{V0}{VX}$$

that N=30. Thereafter, the value of N is rounded to obtain an integer C=30. Thus, the counter 11 outputs a low level, and the number of turned-on PMOS transistors in the PMOSFET array 13 is controlled to be 30. That is, in the third clock cycle, the digital low dropout regulator reaches a reliable voltage value so as to output a reliable voltage.

Exemplarily, the voltage output at the output terminal of the PMOSFET array in the first cycle is set to be V1, V1=0.2V, the voltage output at the output terminal of the PMOSFET array in the second clock cycle is set to be V2, V2=0.25V, and a voltage output at the output terminal of the PMOSFET array in the third clock cycle is set to be V3, V3=0.32V. Then, according to the formula of an average value of the change value of an actual voltage, $$VX = \frac{V3 - V1}{2},$$

it can be derived that VX=0.06V. When the set voltage V0 stored by the divider is set to be 1.7V, then according to the formula $$N = \frac{V0}{VX},$$

it can be derived that N=28.3. Since the value C is an integer obtained by rounding the value of N, C=28. Therefore, the counter 11 outputs a low level, and the number of turned on PMOS transistors in the PMOSFET array 13 is controlled to be 28. Then, in the fourth clock cycle, the digital low dropout regulator achieves a stable voltage value so as to output a stable voltage.

S13, generating a control signal based on the level signal and the first value.

Specifically, the counter 11 generates a control signal by receiving the high-level signal or the low-level signal transmitted from the voltage comparator 10 and the first value transmitted by the divider 14, and transmits the control signal to the decoder 12. Exemplarily, the counter consists of a basic counting unit and a number of control gates. The counting unit consists of a series of various types of flip-flops with an information storage function, which include RS flip-flops, T flip-flops, D flip-flops and JK flip-flop, etc. It can not only record the number of input clock pulses, but also can achieve frequency division, timing, generation of beat pulse and pulse sequence. For example, the timing generator, frequency divider and instruction counter, etc. in a computer all use a counter. There are many types of counters. According to the difference in the manner of clock pulse inputting, counters may be divided into synchronous counters and asynchronous counters. According to the difference in radix system, counters can be divided into binary counters and non-binary counters. According to the numerical increase and decrease tendency during counting, counters can be divided into up counters, down counters and reversible counters.

Optionally, acquiring a clock cycle is to specifically acquire a clock cycle based on the first clock signal CLK1, and the divider 14 acquires the clock cycle based on the clock signal of the second clock signal terminal CLK2. It is to be noted that the clock signals output from the first clock signal CLK1 and the second clock signal CLK2 are synchronized so that the clock cycle of the counter 11 is synchronized with the clock cycle of the divider 14.

S14, the number of turned-on transistors in the PMOSFET array is controlled according to the control signal.

Specifically, the decoder 12 analyzes the first value, i.e., converts the first value into a decimal number by conversion of radix systems, the decimal number being a positive integer, and judges how many high level signals or low level signals there are according to the high level signals or low level signals transmitted by the counter 11 as well as the decimal number. Since the PMOSFET array 13 consists of PMOS transistors, which are cut off at a high level and turned on at a low level, when the decimal number is 20 and the level signal is at a low level, the decoder 12 controls the number of turned-on transistors in the PMOSFET array 13 to be 20.

A control method of a digital low dropout regulator provided by the embodiment of the present invention compares an actual voltage and a reference voltage by receiving the reference voltage and the actual voltage output from the PMOSFET array to obtain a level signal, and calculates based on the output voltage pre-configured for the PMOSFET and the actual voltage output by the PMOSFET array in at least two clock cycles to obtain a first value, the first value corresponding to the number of the controlled PMOSFETs in the PMOSFET array. Thereafter, a control signal is generated according to the level signal and the first value, and the number of turned-on transistors in the PMOSFET array is controlled according to the control signal. The digital low dropout regulator can be enabled to reach the stable voltage value as soon as possible so as to output a stable voltage.

Optionally, the control method of the digital low dropout regulator provided by the embodiment of the present disclosure further comprises shunting the current output by the PMOSFET array.

Exemplarily, the feedback resistor network 15 includes a resistor R1 that shunts the current at the output terminal of the PMOSFET array 13 to avoid damage to the internal device by preventing the current of the digital low dropout regulator from being excessive. Further, the feedback resistor network 15 may also include two or more resistors which are connected in any manner. The present disclosure does not limit the resistors of the feedback resistor network 15 and the manner of connection therebetween, as long as the function of shunting the current at the output terminal of the PMOSFET array 13 can be achieved.

The above content is only specific embodiments of the present invention, but the scope of the present invention is not limited thereto, and any variation or replacement which is readily occurred to person skilled in the art is within the technical scope of the present disclosure, and is covered within the scope of protection of the present invention. Accordingly, the scope of protection of the present invention should be based on the scope of protection of the claims.

What is claimed is:

1. A digital low dropout regulator, comprising:
a voltage comparator, a counter, a decoder, a PMOSFET array, and a divider;
an output terminal of said voltage comparator is connected with a first input terminal of the counter, an output terminal of the counter is connected with an input terminal of the decoder, and an output terminal of the decoder is connected with an input terminal of the PMOSFET array, output terminals of the PMOSFET array are respectively connected with a positive input terminal of the voltage comparator and a first input terminal of the divider, an output terminal of the divider is connected to a second input terminal of the counter, and a negative input terminal of the voltage comparator receives a reference voltage;
said voltage comparator is configured to receive an actual voltage that is output by the PMOSFET array through the positive input terminal, receive a reference voltage through the negative input terminal, compare the actual voltage and the reference voltage to obtain a level signal, and transmit the level signal to the counter;
said divider is configured to calculate based on an output voltage pre-configured for said PMOSFET array and an actual voltage output by said PMOSFET array in at least two clock cycles to obtain a first value and transmit said first value to the counter, wherein the first value corresponds to a number of PMOSFETs in the PMOSFET array controlled by the decoder;
said counter is configured to generate a control signal based on said level signal and said first value and transmit said control signal to said decoder;
said decoder is configured to receive a control signal transmitted by said counter and control a number of transistors, which are switched on, in the PMOSFET array according to the control signal.

2. The digital low dropout regulator according to claim 1, wherein the divider is configured to calculate a value of N according to a formula $$N = \frac{V0}{VX};$$

wherein V0 is the output voltage pre-configured for the PMOSFET array; VX is an average value of a change value in the actual voltage output by the PMOSFET array between every two adjacent cycles among at least two clock cycles.

3. The digital low dropout regulator of claim 2, wherein said divider is further configured to round the value of said N to obtain an integer C, convert the value of C to the first value by conversion of radix systems and transmit the first value to the counter, wherein the conversion of radix systems is conversion from a decimal number to a binary number.

4. The digital low dropout regulator according to claim 3, further comprising:
a feedback resistor network, a first end of which is connected to an output terminal of said PMOSFET array and a second end of which is grounded;
said feedback resistor network is configured to shunt a current output from the output terminal of the PMOSFET array.

5. The digital low dropout regulator according to claim 2, further comprising:
a feedback resistor network, a first end of which is connected to an output terminal of said PMOSFET array and a second end of which is grounded;
said feedback resistor network is configured to shunt a current output from the output terminal of the PMOSFET array.

6. The digital low dropout regulator of claim 1, wherein a third input terminal of the counter is connected with a first clock signal terminal, and a second input terminal of the divider is connected with a second clock signal terminal;
said counter is further configured to obtain a clock cycle according to the first clock signal terminal;
said divider is further configured to store an output voltage pre-configured by the PMOSFET array, and is further configured to obtain a clock cycle based on a clock signal of the second clock signal terminal.

7. The digital low dropout regulator according to claim 6, further comprising:
a feedback resistor network, a first end of which is connected to an output terminal of said PMOSFET array and a second end of which is grounded;
said feedback resistor network is configured to shunt a current output from the output terminal of the PMOSFET array.

8. The digital low dropout regulator according to claim 1, further comprising:
a feedback resistor network, a first end of which is connected to an output terminal of said PMOSFET array and a second end of which is grounded;
said feedback resistor network is configured to shunt a current output from the output terminal of the PMOSFET array.

9. A control method of a digital low dropout regulator for controlling the digital low dropout regulator according to claim 1, said control method comprising:
  receiving the reference voltage and the actual voltage that is output by the PMOSFET array and comparing the actual voltage and the reference voltage to obtain a level signal;
  calculating based on an output voltage pre-configured for the PMOSFET array and an actual voltage output by the PMOSFET array in at least two clock cycles to obtain a first value, the first value corresponding to a number of controlled PMOSFETs in the PMOSFET array;
  generating a control signal based on the level signal and the first value;
  controlling the number of transistors, which are switched on, in the PMOSFET array according to the control signal.

10. The control method of a digital low dropout regulator according to claim 9, wherein said calculating based on an output voltage pre-configured for said PMOSFET array and an actual voltage output from said PMOSFET array in at least two clock cycles comprising:
  calculating a value of N using a formula $$N = \frac{V0}{VX};$$

wherein V0 is a set output voltage; VX is an average value of a change value in the actual voltage output by the PMOSFET array between every two adjacent cycles among at least two clock cycles.

11. The control method of a digital low dropout regulator according to claim 10, wherein said obtaining the first value includes:
  rounding the value of said N to obtain an integer C and converting the value of said C into said first value by conversion of radix systems, wherein the conversion of radix systems is conversion from a decimal number to a binary number.

12. The control method of a digital low dropout regulator according to claim 11, said control method further comprising:
  shunting a current output by the PMOSFET array.

13. The control method of a digital low dropout regulator according to claim 10, said control method further comprising:
  shunting a current output by the PMOSFET array.

14. The control method of a digital low dropout regulator according to claim 9, said control method further comprising:
  obtaining a clock cycle, and storing an output voltage pre-configured for the PMOSFET array.

15. The control method of a digital low dropout regulator according to claim 14, said control method further comprising:
  shunting a current output to the PMOSFET array.

16. The control method of a digital low dropout regulator according to claim 9, said control method further comprising:
  shunting a current output by the PMOSFET array.

* * * * *